United States Patent
Kojima et al.

(10) Patent No.: US 12,122,061 B2
(45) Date of Patent: Oct. 22, 2024

(54) PROCESSING METHOD AND PROCESSING APPARATUS

(71) Applicant: DISCO CORPORATION, Tokyo (JP)

(72) Inventors: Yoshimasa Kojima, Tokyo (JP); Yusuke Kajihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 615 days.

(21) Appl. No.: 17/155,522

(22) Filed: Jan. 22, 2021

(65) Prior Publication Data

US 2021/0237297 A1   Aug. 5, 2021

(30) Foreign Application Priority Data

Jan. 30, 2020   (JP) .................................. 2020-013520

(51) Int. Cl.
*B26D 5/00* (2006.01)
*B26D 7/22* (2006.01)

(52) U.S. Cl.
CPC ............... *B26D 5/007* (2013.01); *B26D 7/22* (2013.01)

(58) Field of Classification Search
CPC . H01L 21/67092; H01L 21/681; H01L 21/78; B26D 7/22; B26D 5/007
See application file for complete search history.

(56) References Cited

U.S. PATENT DOCUMENTS

| | | | | |
|---|---|---|---|---|
| 5,515,167 A * | 5/1996 | Ledger | .................... | G03F 7/707 257/E21.53 |
| 5,539,514 A * | 7/1996 | Shishido | .............. | G01N 21/956 356/239.8 |
| 5,652,657 A * | 7/1997 | Yoshii | .................... | G01N 21/94 356/394 |
| 5,978,078 A * | 11/1999 | Salamati-Saradh | ..... | G03F 7/707 356/337 |
| 6,134,014 A * | 10/2000 | Tzu | .......................... | G03F 1/30 356/519 |
| 6,628,379 B1 * | 9/2003 | Sudo | .................. | G01N 21/8806 356/238.1 |

(Continued)

FOREIGN PATENT DOCUMENTS

| | | |
|---|---|---|
| DE | 102018201156 A1 | 8/2018 |
| JP | 2010082644 A | 4/2010 |
| JP | 2010087141 A | 4/2010 |

OTHER PUBLICATIONS

Office action issued in counterpart German patent application No. 10 2021 200 656.6, dated Jul. 19, 2023.

*Primary Examiner* — Sang H Nguyen
(74) *Attorney, Agent, or Firm* — Greer, Burns & Crain, Ltd.

(57) ABSTRACT

There is provided a method for executing processing for a workpiece. The method includes a table imaging step of imaging a foreign object of a transparent part of a holding table having the transparent part composed of a transparent member at least in part of a holding surface and forming a foreign object taken image, a holding step of holding the workpiece by the holding table after executing the table imaging step, a workpiece imaging step of imaging the workpiece held by the holding table through the transparent part and forming a workpiece taken image, and a processing step of executing cutting for the workpiece held by the holding table by a cutting unit.

15 Claims, 13 Drawing Sheets

(56) References Cited

U.S. PATENT DOCUMENTS

| | | | | |
|---|---|---|---|---|
| 2002/0131052 A1* | 9/2002 | Emery | ................... | G03F 1/72 |
| | | | | 73/602 |
| 2008/0102606 A1* | 5/2008 | Sekiya | ................... | H01L 21/78 |
| | | | | 257/E21.536 |
| 2009/0139542 A1* | 6/2009 | Furukawa | ......... | H01L 21/67259 |
| | | | | 382/149 |
| 2010/0171823 A1* | 7/2010 | Yamamoto | ............ | H01L 21/681 |
| | | | | 356/138 |
| 2014/0071437 A1* | 3/2014 | Reich | ................... | G01J 1/4257 |
| | | | | 356/121 |
| 2017/0301571 A1* | 10/2017 | Tsuchiya | ............. | H01L 21/6836 |
| 2018/0292985 A1* | 10/2018 | Hidaka | ................ | G06F 3/0488 |
| 2019/0271962 A1* | 9/2019 | Miyata | ................ | G05B 19/402 |
| 2019/0317471 A1* | 10/2019 | Kashiwagi | ........... | G05B 19/402 |
| 2020/0266091 A1* | 8/2020 | Tanaka | ................ | H01L 21/6838 |
| 2020/0333261 A1* | 10/2020 | Sugiyama | ............. | G06T 7/0004 |
| 2020/0335377 A1* | 10/2020 | Masuda | ............. | H01L 21/6838 |

\* cited by examiner

PROCESSING METHOD AND PROCESSING APPARATUS

BACKGROUND OF THE INVENTION

Field of the Invention

The present invention relates to a processing method and processing apparatus.

Description of the Related Art

Processing apparatus that processes a workpiece, such as cutting apparatus, often identifies the processing position of the workpiece processed by a processing unit such as a cutting blade or checks a cut groove that is a processing result. In some cases, as processing apparatus, apparatus is used in which a holding table that holds a workpiece includes a transparent part composed of a transparent member in order to enable imaging of the workpiece from the lower side (for example, refer to Japanese Patent Laid-open No. 2010-87141 and Japanese Patent Laid-open No. 2010-82644).

SUMMARY OF THE INVENTION

In the above-described processing apparatus, when a workpiece is imaged in the state in which a scratch is formed in a holding surface of the holding table or in the state in which contamination adheres to the holding surface, the scratch or contamination appears in a taken image. When identification of a processing position or check of a processing result is executed based on the taken image in which the contamination or scratch appears, possibly identification of the accurate processing position or grasping of the processing result is impossible. Thus, improvement is desired. As above, the above-described processing apparatus involves the possibility that the detection result of the workpiece imaged through the transparent part deteriorates.

Thus, an object of the present invention is to provide a processing method and processing apparatus that can suppress the deterioration of a detection result of a workpiece imaged through a transparent part.

In accordance with an aspect of the present invention, there is provided a processing method for executing processing for a workpiece. The processing method includes a table imaging step of imaging a foreign object of a transparent part of a holding table having the transparent part composed of a transparent member at least in part of a holding surface and forming a foreign object taken image, a holding step of holding the workpiece by the holding table after executing the table imaging step, a workpiece imaging step of imaging the workpiece held by the holding table through the transparent part and forming a workpiece taken image, and a processing step of executing processing for the workpiece held by the holding table by a processing unit. In the workpiece imaging step, imaging is executed excluding the foreign object of the transparent part imaged in the table imaging step.

Preferably, the position of the foreign object is identified from the foreign object taken image and imaging is executed with avoidance of the position of the foreign object in the workpiece imaging step.

Preferably, the processing method further includes an image processing step of removing the foreign object from the workpiece taken image on the basis of the foreign object taken image.

Preferably, the processing method further includes a processing position identification step of identifying a processing position of the workpiece on the basis of the workpiece taken image after executing the workpiece imaging step and before executing the processing step.

Preferably, the processing method further includes a check step of checking a processing state of the workpiece on the basis of the workpiece taken image during or after execution of the processing step after executing the workpiece imaging step.

In accordance with another aspect of the present invention, there is provided processing apparatus used for the processing method. The processing apparatus includes a holding table having a transparent part composed of a transparent member at least in part of a holding surface, a processing unit that executes processing for a workpiece held by the holding table, and a camera for detection that detects a foreign object.

Preferably, the processing apparatus further includes a workpiece imaging camera that images a held surface of the workpiece held by the holding table through the transparent part. The camera for detection is disposed on the opposite side to the workpiece imaging camera across the holding table.

The present invention provides an effect that the deterioration of the detection result of the workpiece imaged through the transparent part can be suppressed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Embodiments of the present invention will be described in detail below with reference to the drawings. The present invention is not limited by contents described in the following embodiments. Furthermore, what can be easily envisaged by those skilled in the art and what are substantially the same are included in constituent elements described below. Moreover, configurations described below can be combined as appropriate. In addition, various kinds of omission, replacement, or change of a configuration can be executed without departing from the gist of the present invention.

First Embodiment

Figure 1:
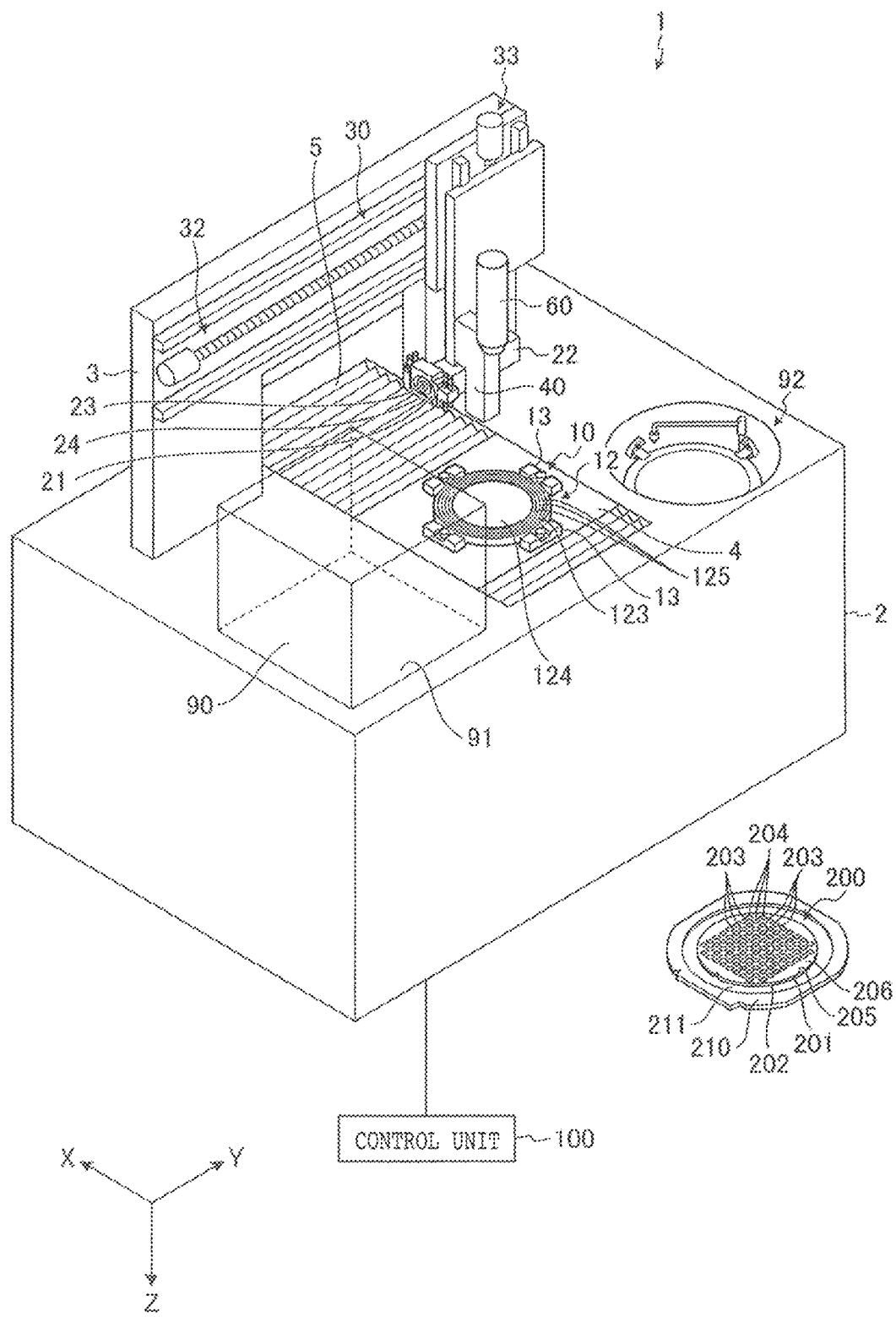
FIG. 1 is a perspective view illustrating a configuration example of processing apparatus according to a first embodiment.
Figure 2:
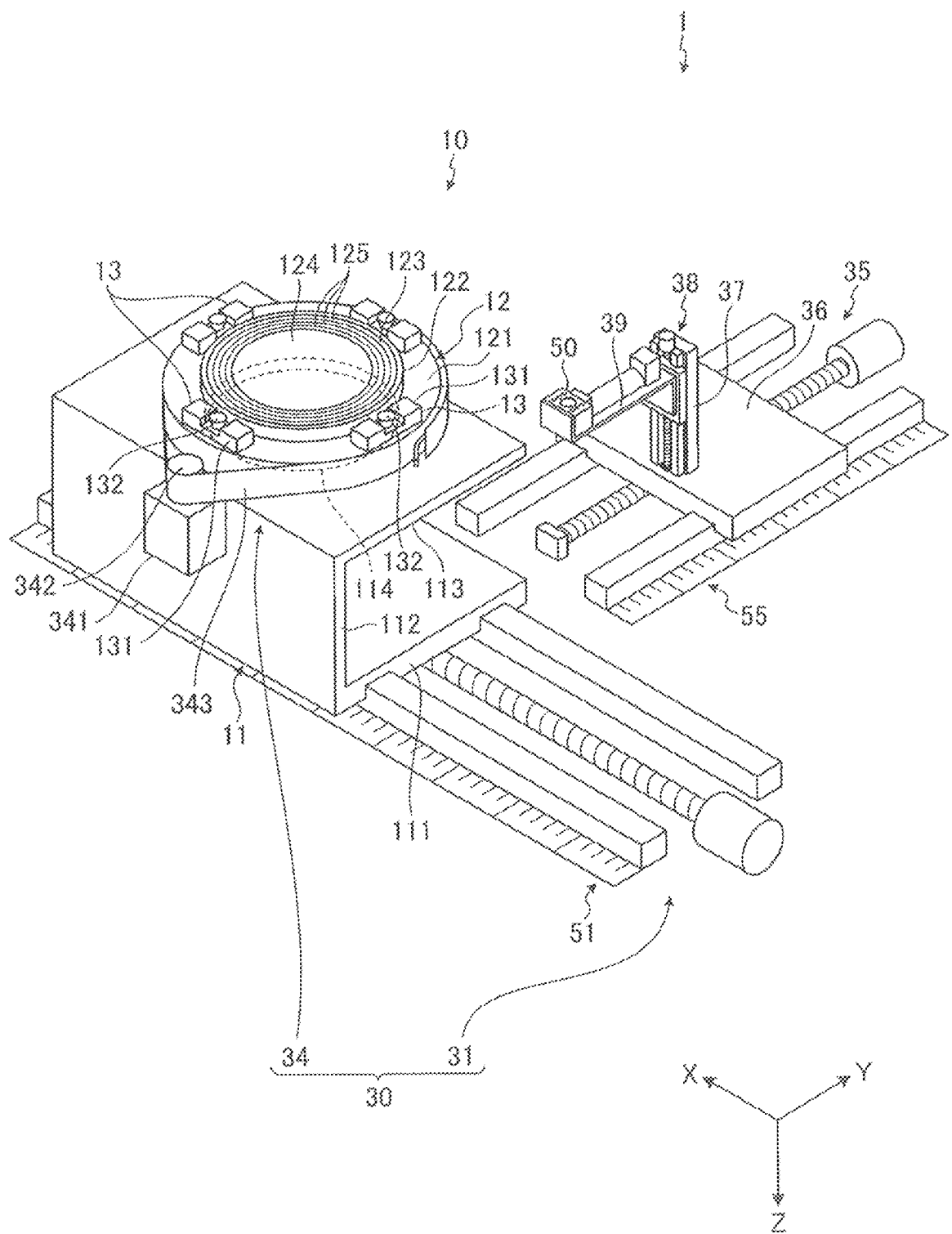
FIG. 2 is a perspective view illustrating a holding unit and an imaging camera of the processing apparatus illustrated in FIG. 1.

Processing apparatus according to a first embodiment of the present invention will be described based on drawings. FIG. 1 is a perspective view illustrating a configuration example of the processing apparatus according to the first embodiment. FIG. 2 is a perspective view illustrating a holding unit and an imaging camera of the processing apparatus illustrated in FIG. 1.

Processing apparatus 1 according to the first embodiment is processing apparatus used for a processing method according to the first embodiment and is cutting apparatus that cuts (equivalent to processing) a workpiece 200. The workpiece 200 of a processing target of the processing apparatus 1 illustrated in FIG. 1 is a wafer such as a circular-disc-shaped semiconductor wafer or optical device wafer including silicon, sapphire, gallium arsenide, silicon carbide (SiC), or the like as a substrate 201. In the workpiece 200, devices 204 are formed in regions marked out in a lattice manner by plural streets 203 on a front surface 202 of the substrate 201.

The device 204 is a circuit such as an integrated circuit (IC) or large scale integration (LSI) or an image sensor of a charge coupled device (CCD), complementary metal oxide semiconductor (CMOS), or the like. In the first embodiment, in the workpiece 200, a metal film 206 is formed on a back surface 205 on the back side of the front surface 202 of the substrate 201. In the workpiece 200, since the metal film 206 is formed on the back surface 205, it is impossible to detect the street 203 when imaging is executed by an infrared camera from the side of the back surface 205.

In the first embodiment, in the workpiece 200, the front surface 202 is stuck to a tape 211 having a peripheral edge on which an annular frame 210 is mounted. The workpiece 200 is supported by the annular frame 210 and the metal film 206 on the side of the back surface 205 is oriented upward. In the first embodiment, the metal film 206 is formed on the back surface 205 of the substrate 201 in the workpiece 200. However, in the present invention, the metal film 206 does not have to be formed, and the back surface 205 may be stuck to the tape 211 and the side of the front surface 202 may be oriented upward.

The processing apparatus 1 illustrated in FIG. 1 is cutting apparatus that holds the workpiece 200 by a holding table 12 of a holding unit 10 and cuts the workpiece 200 along the streets 203 by a cutting blade 21 to divide the workpiece 200 into the individual devices 204. As illustrated in FIG. 1, the processing apparatus 1 includes the holding unit 10, a cutting unit 20, a movement unit 30, an upper-side camera 40, a camera 60 for detection, and a control unit 100.

As illustrated in FIG. 2, the holding unit 10 includes a chassis 11 moved in an X-axis direction parallel to the horizontal direction by an X-axis movement unit 31 of the movement unit 30, the holding table 12 disposed on the chassis 11 rotatably around the axis center parallel to a Z-axis direction along the vertical direction, and plural frame fixing parts 13 disposed around a holding surface 124 of the holding table 12.

In the first embodiment, the chassis 11 includes a lower plate 111 that is moved in the X-axis direction by the X-axis movement unit 31 and is parallel to the horizontal direction, a side plate 112 disposed upright from the outer edge of the lower plate 111, and an upper plate 113 that has the outer edge continuous with the upper end of the side plate 112 and is parallel to the lower plate 111.

The holding table 12 holds the workpiece 200 on the holding surface 124 and is supported by the upper plate 113 rotatably around the axis center. The holding table 12 has a circular annular support member 121 supported by the upper plate 113 rotatably around the axis center parallel to the Z-axis direction, a circular annular frame body 122 disposed on the support member 121, and a transparent part 123 that is fitted into the inside of the frame body 122 and has a circular plate shape. In the holding table 12, the support member 121, the frame body 122, and the transparent part 123 are disposed at positions at which they are coaxial with each other.

The transparent part 123 is composed of a transparent member such as quartz glass, borosilicate glass, sapphire, calcium fluoride, lithium fluoride, or magnesium fluoride, and the upper surface thereof is the holding surface 124 that holds the workpiece 200. Plural suction grooves 125 are formed in the holding surface 124. In the first embodiment, the plural suction grooves 125 are formed into circular shapes that are concentrically disposed at the peripheral part of the holding surface 124 and are different from each other in the diameter. In the holding table 12, the side of the front surface 202 of the workpiece 200 is placed over the holding surface 124 with the intermediary of the tape 211. In the first embodiment, the holding table 12 has the transparent part 123 composed of the transparent member in the whole of the holding surface 124. However, in the present invention, the holding table 12 may have the transparent part 123 composed of the transparent member at least in part of the holding surface 124.

The frame fixing parts 13 are disposed at the outer edge part of the support member 121 and each include a frame support part 131 having an upper surface over which the annular frame 210 is placed and a vacuum pad 132 that sucks and holds the annular frame 210 placed over the upper surface of the frame support part 131.

In the holding table 12, the suction grooves 125 and the vacuum pads 132 are connected to a vacuum suction source that is not illustrated in the diagram and suction is executed by the vacuum suction source. Thereby, the holding table 12 sucks the workpiece 200 placed over the holding surface 124 to the holding surface 124 to hold the workpiece 200 over the holding surface 124 and sucks the annular frame 210 placed over the upper surfaces of the frame support parts 131 to the frame fixing parts 13 to hold the annular frame 210 over the frame fixing parts 13. In the first embodiment, the holding table 12 sucks the side of the front surface 202 of the workpiece 200 to the holding surface 124 to hold the workpiece 200 over the holding surface 124 with the intermediary of the tape 211 and sucks the annular frame 210 to the frame fixing parts 13 to hold the annular frame 210 over the frame fixing parts 13 with the intermediary of the tape 211. Furthermore, in the first embodiment, a circular through-hole 114 is made in the upper plate 113 of the chassis 11 in the holding unit 10. The through-hole 114 is disposed at such a position as to be mutually coaxial with the support member 121, the frame body 122, and the transparent part 123 of the holding table 12.

The movement unit 30 includes the X-axis movement unit 31 that is a processing feed unit illustrated in FIG. 2, a Y-axis movement unit 32 that is an indexing feed unit illustrated in FIG. 1, a Z-axis movement unit 33 that is a cutting-in feed unit illustrated in FIG. 1, and a rotational movement unit 34 that rotates the holding table 12 illustrated in FIG. 2 around the axis center parallel to the Z-axis direction.

The X-axis movement unit 31 is a unit that moves the holding table 12 and the cutting unit 20 relatively in the X-axis direction by moving the lower plate 111 of the chassis 11 of the holding unit 10 in the X-axis direction. The X-axis movement unit 31 moves the holding table 12 in the X-axis direction between a carrying-in/out region 4 in which the workpiece 200 is carried in and out to and from the holding table 12 and a processing region 5 in which cutting processing of the workpiece 200 held by the holding table 12 is executed. The Y-axis movement unit 32 is a unit that moves the cutting unit 20 in a Y-axis direction that is parallel to the horizontal direction and is orthogonal to the X-axis direction to thereby move the holding table 12 and the cutting unit 20 relatively in the Y-axis direction. The Z-axis movement unit 33 is a unit that moves the holding table 12 and the cutting unit 20 relatively in the Z-axis direction by moving the cutting unit 20 in the Z-axis direction.

The X-axis movement unit 31, the Y-axis movement unit 32, and the Z-axis movement unit 33 each include a well-known ball screw disposed rotatably around the axis center, a well-known motor that rotates the ball screw around the axis center, and well-known guide rails that support the holding table 12 or the cutting unit 20 movably in the X-axis direction, the Y-axis direction, or the Z-axis direction.

The rotational movement unit 34 is a unit that rotates the holding table 12 around the axis center parallel to the Z-axis direction. The rotational movement unit 34 rotates the holding table 12 around the axis center in a range over 180 degrees and under 360 degrees. The rotational movement unit 34 includes a motor 341 fixed to the side plate 112 of the chassis 11, a pulley 342 joined to an output shaft of the motor 341, and a belt 343 that is wound around the outer circumference of the support member 121 of the holding table 12 and is rotated around the axis center by the pulley 342. When rotating the motor 341, the rotational movement unit 34 rotates the holding table 12 around the axis center through the pulley 342 and the belt 343. Furthermore, in the first embodiment, the rotational movement unit 34 can rotate the holding table 12 by 220 degrees in both one direction around the axis center and the other direction that is the opposite direction to the one direction.

The cutting unit 20 is a processing unit that executes cutting for the workpiece 200 held by the holding table 12 with the cutting blade 21. The cutting unit 20 is disposed movably in the Y-axis direction by the Y-axis movement unit 32 and is disposed movably in the Z-axis direction by the Z-axis movement unit 33 with respect to the workpiece 200 held by the holding table 12. The cutting unit 20 is set on a support frame 3 disposed upright from an apparatus main body 2 with the intermediary of the Y-axis movement unit 32, the Z-axis movement unit 33, and so forth.

The cutting unit 20 can position the cutting blade 21 to an optional position on the holding surface 124 of the holding table 12 by the Y-axis movement unit 32 and the Z-axis movement unit 33. The cutting unit 20 includes the cutting blade 21, a spindle housing 22 disposed movably in the Y-axis direction and the Z-axis direction by the Y-axis movement unit 32 and the Z-axis movement unit 33, a spindle 23 that is disposed in the spindle housing 22 rotatably around the axis center and is rotated by a motor and has a tip on which the cutting blade 21 is mounted, and a cutting water nozzle 24.

The cutting blade 21 is a component that cuts the workpiece 200 held by the holding table 12, and is a very-thin cutting abrasive stone having a substantially ring shape. In the first embodiment, the cutting blade 21 is a so-called hub blade including a circular base having a circular annular shape and a circular annular cutting edge that is disposed at the outer circumferential edge of the circular base and cuts the workpiece 200. The cutting edge is composed of abrasive grains of diamond, cubic boron nitride (CBN), or the like and a bond material (binder) of a metal, resin, or the like and is formed to a predetermined thickness. In the present invention, the cutting blade 21 may be a so-called washer blade composed only of a cutting edge.

The spindle 23 rotates the cutting blade 21 around axis center by being rotated around the axis center by the motor. The axis center of the cutting blade 21 and the spindle 23 of the cutting unit 20 is parallel to the Y-axis direction. The cutting water nozzle 24 is a component that is disposed at the tip of the spindle housing 22 and supplies cutting water to the workpiece 200 and the cutting blade 21 during cutting of the workpiece 200 by the cutting blade 21.

The upper-side camera 40 is fixed to the cutting unit 20 so as to move integrally with the cutting unit 20. The upper-side camera 40 includes plural imaging elements that image the workpiece 200 held by the holding table 12 from the upper side. The imaging elements are CCD imaging elements or CMOS imaging elements, for example. The upper-side camera 40 images the workpiece 200 held by the holding table 12 and outputs an obtained image to the control unit 100.

In the first embodiment, the camera 60 for detection is disposed above the holding table 12 positioned in the carrying-in/out region 4. The camera 60 for detection includes imaging elements that image the transparent part 123 of the holding table 12 from the upper side. The imaging elements are CCD imaging elements or CMOS imaging elements, for example. The camera 60 for detection images the transparent part 123 of the holding table 12 and outputs an obtained image to the control unit 100.

In the first embodiment, the camera 60 for detection has the field of view with which the holding surface 124 of the holding table 12 positioned in the carrying-in/out region 4 can be imaged at once. However, the present invention is not limited thereto, and the field of view may be smaller than the holding surface 124 of the holding table 12 and the holding surface 124 may be imaged plural times in a divided manner. Furthermore, in the present invention, the position of the camera 60 for detection is not limited to the position above the holding table 12 positioned in the carrying-in/out region 4. It suffices that the camera 60 for detection is disposed in a range in which it is possible to image the transparent part 123 of the holding table 12 positioned at any position in the range of movement by the X-axis movement unit 31.

Furthermore, the image obtained by imaging by the camera 60 for detection defines the intensity of light received by each pixel of the imaging element on the basis of grayscales at plural stages (for example, 256 stages). That is, the image obtained by imaging by the camera 60 for detection is an image in which whether light is strong or weak is represented at the stage according to the intensity of the light received by each pixel, i.e., an image having the contrasting density. The camera 60 for detection images the transparent part 123 of the holding table 12 and detects foreign objects 301 and 302 (illustrated in FIG. 5) on the transparent part 123. The foreign objects 301 and 302 in the present invention refer to objects regarding which the difference in the intensity of light from the other part of the transparent part 123 in an image obtained by imaging is equal to or larger than a predetermined value when the transparent part 123 is imaged by the camera 60 for detection, and refer to, for example, contamination of the transparent part 123 or a scratch formed in the transparent part 123.

Moreover, as illustrated in FIG. 2, the processing apparatus 1 further has a workpiece imaging camera 50 that images the front surface 202 that is the held surface of the workpiece 200 held by the holding table 12 through the transparent part 123. The workpiece imaging camera 50 is a component that images the side of the front surface 202 of the workpiece 200 held by the holding table 12 from the lower side of the workpiece 200 through the transparent part 123. Since the workpiece imaging camera 50 is the component that executes imaging from the lower side of the workpiece 200 through the transparent part 123, the camera 60 for detection is disposed on the opposite side to the workpiece imaging camera 50 across the holding table.

In the first embodiment, the workpiece imaging camera 50 is disposed adjacent to the holding unit 10 in the Y-axis direction. Furthermore, the workpiece imaging camera 50 is disposed movably in the Y-axis direction by a second Y-axis movement unit 35 disposed on the apparatus main body 2 and is disposed movably in the Z-axis direction by a second Z-axis movement unit 38 disposed on an upright column 37 disposed upright from a moving plate 36 moved in the Y-axis direction by the second Y-axis movement unit 35. In the first embodiment, the workpiece imaging camera 50 is attached to one end of a horizontal extending member 39 with the other end attached to a rising-lowering member that can freely move in the Z-axis direction by the second Z-axis movement unit 38.

The second Y-axis movement unit 35 and the second Z-axis movement unit 38 each include a well-known ball screw disposed rotatably around the axis center, a well-known motor that rotates the ball screw around the axis center, and well-known guide rails that support the moving plate or the workpiece imaging camera 50 movably in the Y-axis direction or the Z-axis direction.

The workpiece imaging camera 50 includes imaging elements that image the workpiece 200 held by the holding table 12 from the lower side through the transparent part 123. The imaging elements are CCD imaging elements or CMOS imaging elements, for example. The workpiece imaging camera 50 images the workpiece 200 held by the holding table 12 and outputs an obtained image to the control unit 100.

Furthermore, the processing apparatus 1 includes an X-axis direction position detecting unit 51 (illustrated in FIG. 2) for detecting the position of the holding table 12 in the X-axis direction, a Y-axis direction position detecting unit that is for detecting the position of the cutting unit 20 in the Y-axis direction and is not illustrated in the diagram, and a Z-axis direction position detecting unit for detecting the position of the cutting unit 20 in the Z-axis direction. The X-axis direction position detecting unit 51 and the Y-axis direction position detecting unit can be configured by a linear scale parallel to the X-axis direction or the Y-axis direction and a reading head. The Z-axis direction position detecting unit detects the position of the cutting unit 20 in the Z-axis direction by pulses of the motor. The X-axis direction position detecting unit 51, the Y-axis direction position detecting unit, and the Z-axis direction position detecting unit output, to the control unit 100, the position of the holding table 12 in the X-axis direction or the position of the cutting unit 20 in the Y-axis direction or the Z-axis direction.

Moreover, the processing apparatus 1 includes a second Y-axis direction position detecting unit 55 (illustrated in FIG. 2) that detects the position of the workpiece imaging camera 50 in the Y-axis direction. The second Y-axis direction position detecting unit 55 can be configured by a linear scale parallel to the Y-axis direction and a reading head. The second Y-axis direction position detecting unit 55 outputs the position of the workpiece imaging camera 50 in the Y-axis direction to the control unit 100. The positions of the holding table 12, the cutting unit 20, and the imaging camera in the respective axis directions detected by the respective position detecting units are defined on the basis of a predefined reference position of the processing apparatus 1. That is, in the processing apparatus 1 according to the first embodiment, the respective positions are defined on the basis of the predefined reference position.

In addition, the processing apparatus 1 includes a cassette elevator 91 on which a cassette 90 that houses plural workpieces 200 before and after cutting is placed and that moves the cassette 90 in the Z-axis direction. The processing apparatus 1 further includes a cleaning unit 92 that cleans the workpiece 200 after cutting and a conveying unit that carries out and in the workpiece 200 from and to the cassette 90 and conveys the workpiece 200 and is not illustrated in the diagram.

The control unit 100 is a unit that controls each of the above-described respective constituent elements of the processing apparatus 1 and causes the processing apparatus 1 to execute processing operation for the workpiece 200. The control unit 100 is a computer having an arithmetic processing device having a microprocessor such as a central processing unit (CPU), a storing device having a memory such as a read only memory (ROM) or a random access memory (RAM), and an input-output interface device. The arithmetic processing device of the control unit 100 executes arithmetic processing according to a computer program stored in the storing device and outputs a control signal for controlling the processing apparatus 1 to the above-described constituent elements of the processing apparatus 1 through the input-output interface device.

Furthermore, the processing apparatus 1 is connected to a display unit that is not illustrated in the diagram and is connected to the control unit 100 and is configured by liquid crystal display device or the like that displays the state of processing operation, an image, and so forth, and an input unit that is connected to the control unit 100 and is used when an operator registers processing contents information or the like. In the first embodiment, the input unit is configured by at least one of a touch panel disposed on the display unit and external input device such as a keyboard.

Figure 3:
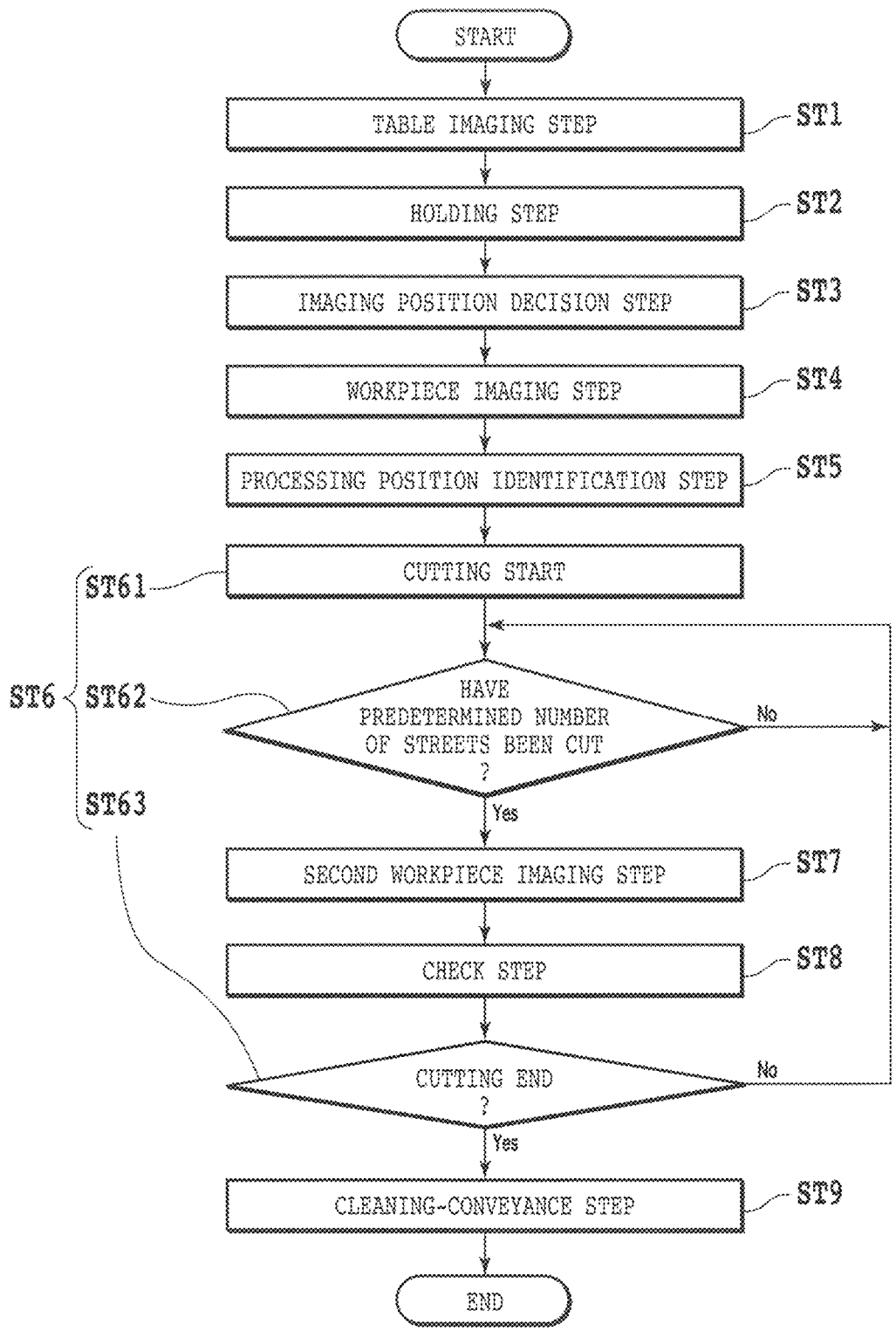
FIG. 3 is a flowchart illustrating the flow of a processing method according to the first embodiment.

Next, the processing method according to the first embodiment will be described based on drawings. FIG. 3 is a flowchart illustrating the flow of the processing method according to the first embodiment. The processing method according to the first embodiment is a method in which cutting is executed for one workpiece 200 by the above-described processing apparatus 1 and is also processing operation by the processing apparatus 1. First, an operator registers processing contents information in the control unit 100 and sets the cassette 90 that houses plural workpieces 200 before cutting processing on the cassette elevator 91.

The processing contents information includes an imaging position that is the position of the workpiece 200 imaged by the workpiece imaging camera 50 in implementation of position adjustment between the workpiece 200 and the cutting blade 21, i.e., alignment to identify the processing position of the workpiece 200. The processing contents information further includes an imaging position that is the position of the workpiece 200 imaged by the workpiece imaging camera 50 in implementation of kerf check to check the processing state of the workpiece 200 regarding whether or not deviation of a cut groove 400 (illustrated in FIG. 10) formed in the workpiece 200 from a desired position, the size of chippings generated at both edges of the cut groove 400, and so forth fall within a predetermined range.

Thereafter, the processing apparatus 1 starts the processing method according to the first embodiment when the control unit 100 accepts an instruction to start processing operation from an operator. As illustrated in FIG. 3, the processing method according to the first embodiment includes a table imaging step ST1, a holding step ST2, an imaging position decision step ST3, a workpiece imaging step ST4, a processing position identification step ST5, a processing step ST6, a second workpiece imaging step ST7, a check step ST8, and a cleaning-conveyance step ST9.
(Table Imaging Step)

Figure 4:
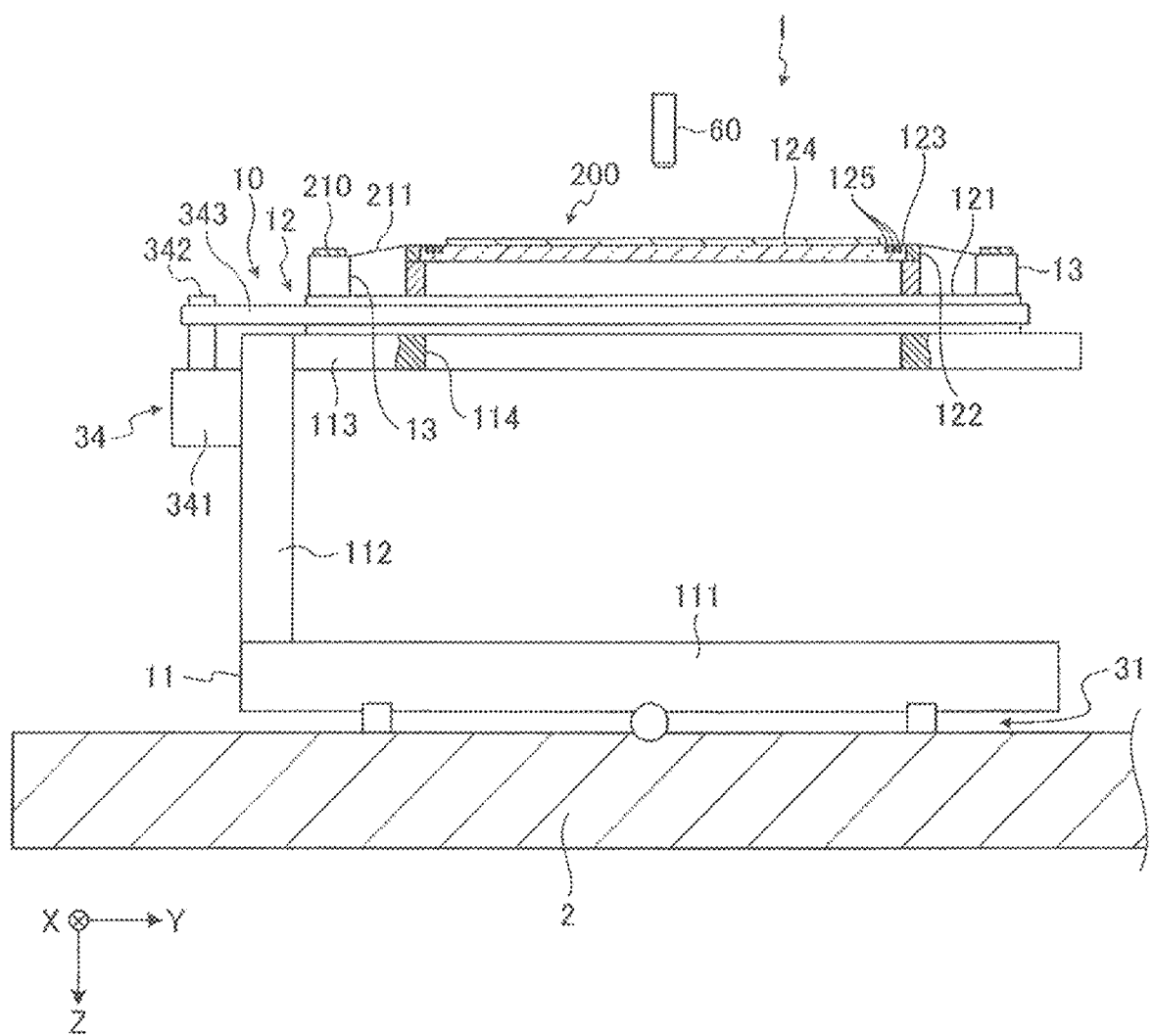
FIG. 4 is a partial sectional side view illustrating a table imaging step of the processing method illustrated in FIG. 3.
Figure 5:
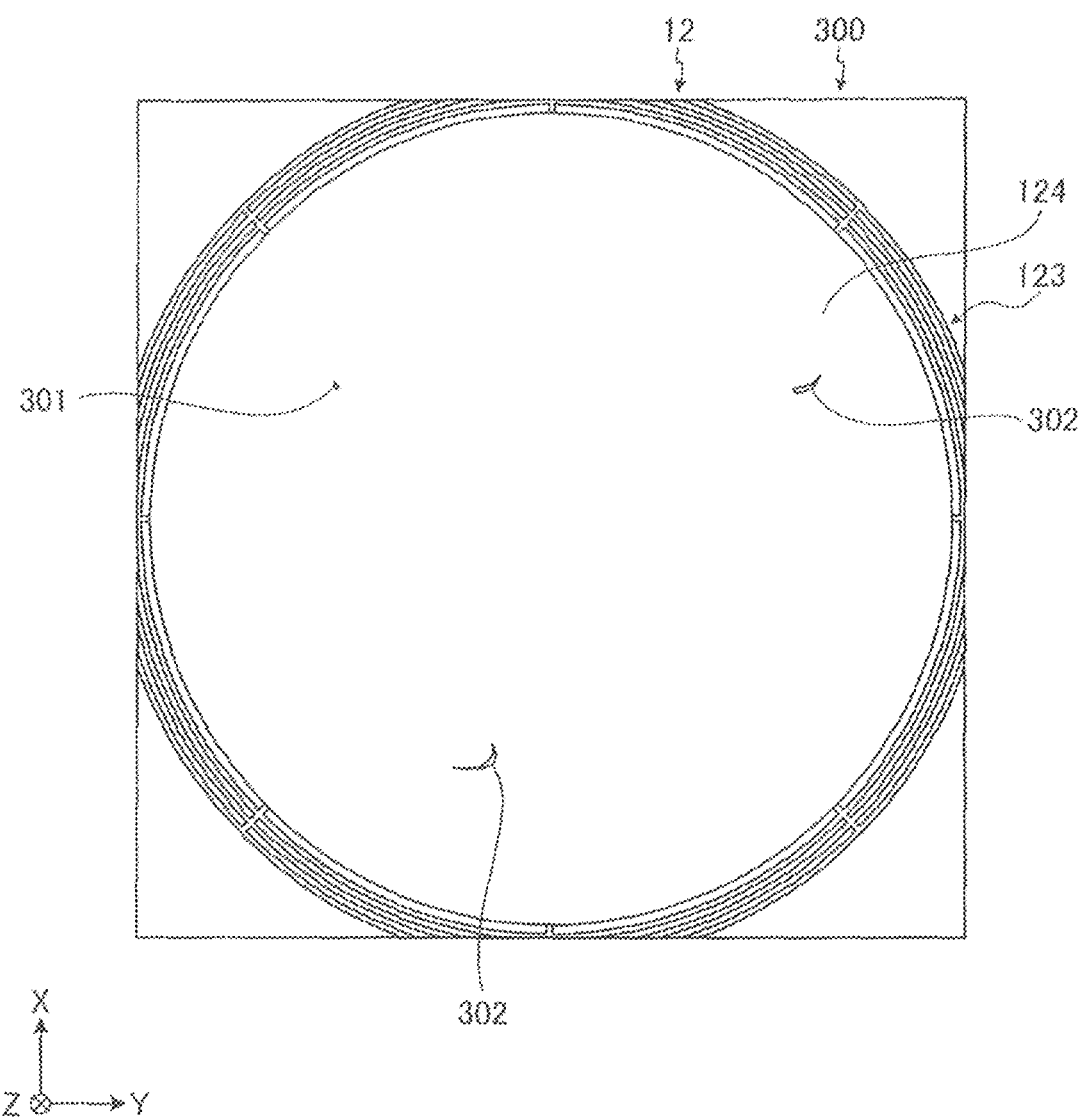
FIG. 5 is a diagram illustrating one example of a foreign object taken image obtained in the table imaging step of the processing method illustrated in FIG. 3.

FIG. 4 is a partial sectional side view illustrating the table imaging step of the processing method illustrated in FIG. 3. FIG. 5 is a diagram illustrating one example of a foreign object taken image obtained in the table imaging step of the processing method illustrated in FIG. 3.

The table imaging step ST1 is a step of imaging the foreign objects 301 and 302 of the transparent part 123 of the holding table 12 and forming a foreign object taken image 300 illustrated in FIG. 5. In the table imaging step ST1, in the processing apparatus 1, the control unit 100 controls the X-axis movement unit 31 to position the holding table 12 to the carrying-in/out region 4 as illustrated in FIG. 4. In the table imaging step ST1, in the processing apparatus 1, the control unit 100 causes the transparent part 123 of the holding table 12 to be imaged by the camera 60 for detection and obtains the foreign object taken image 300 illustrated in FIG. 5.

In the table imaging step ST1, in the processing apparatus 1, the control unit 100 extracts pixels regarding which the difference in the intensity of light from pixels resulting from imaging of the other part of the transparent part 123 in the foreign object taken image 300 obtained by the imaging by the camera 60 for detection is equal to or larger than a predetermined value, and detects the foreign objects 301 and 302 on the transparent part 123. In the example illustrated in FIG. 5, contamination on the transparent part 123 is detected as the foreign object 301 and scratches on the transparent part 123 are detected as the foreign objects 302. In the table imaging step ST1, in the processing apparatus 1, the control unit 100 stores the foreign object taken image 300. In addition, the control unit 100 identifies the positions of the detected foreign objects 301 and 302 in the X-axis direction and the Y-axis direction and stores the identified positions.

In the first embodiment, the control unit 100 calculates the positions of the pixels detected as the foreign objects 301 and 302 in the foreign object taken image 300 as the positions of the foreign objects 301 and 302. In the first embodiment, in the table imaging step ST1, in the processing apparatus 1, the control unit 100 stores the foreign object taken image 300 and identifies and stores the positions of the foreign objects 301 and 302. Then, the processing apparatus 1 proceeds to the holding step ST2.
(Holding Step)

Figure 6:
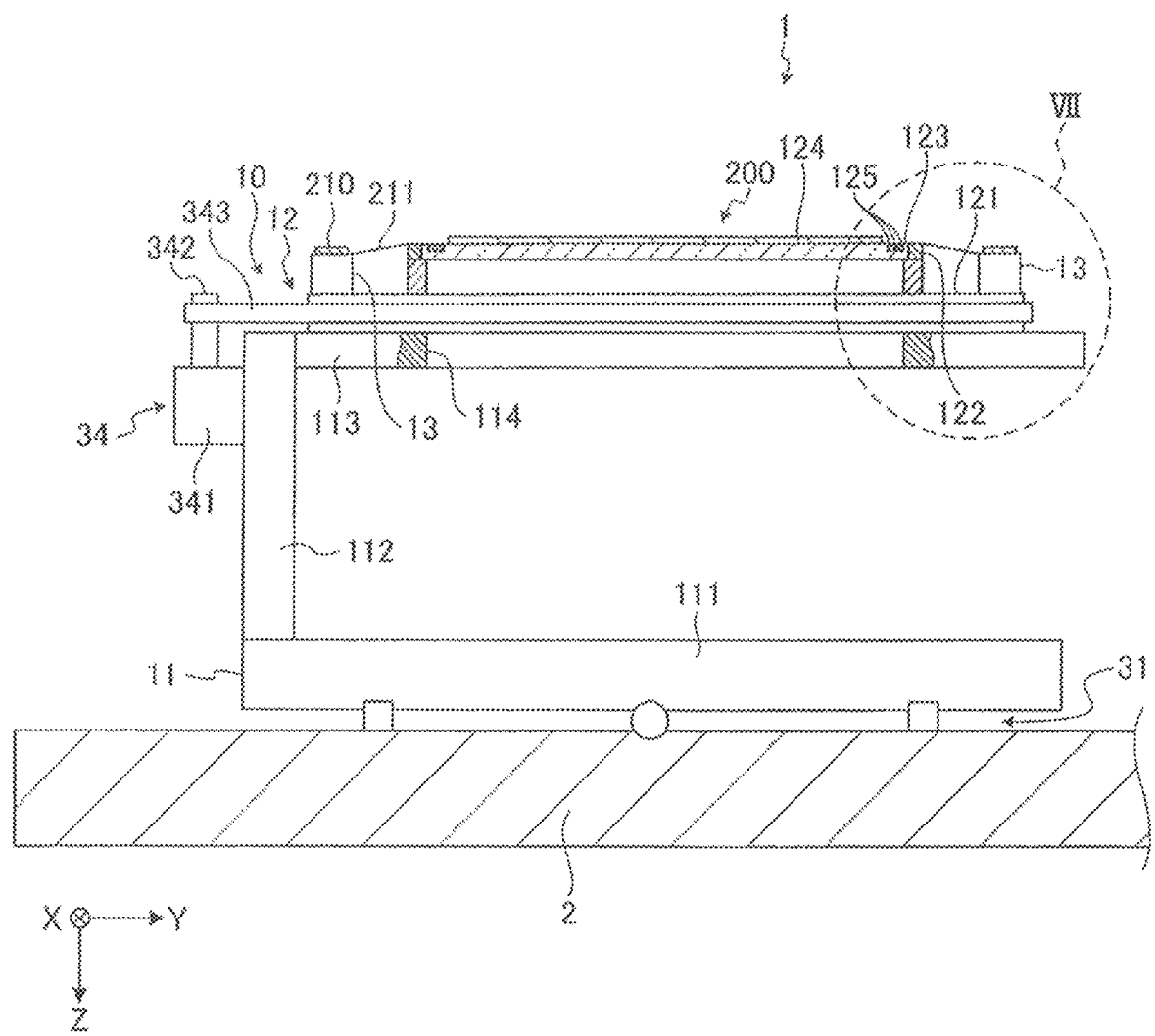
FIG. 6 is a partial sectional side view illustrating a holding step of the processing method illustrated in FIG. 3.
Figure 7:
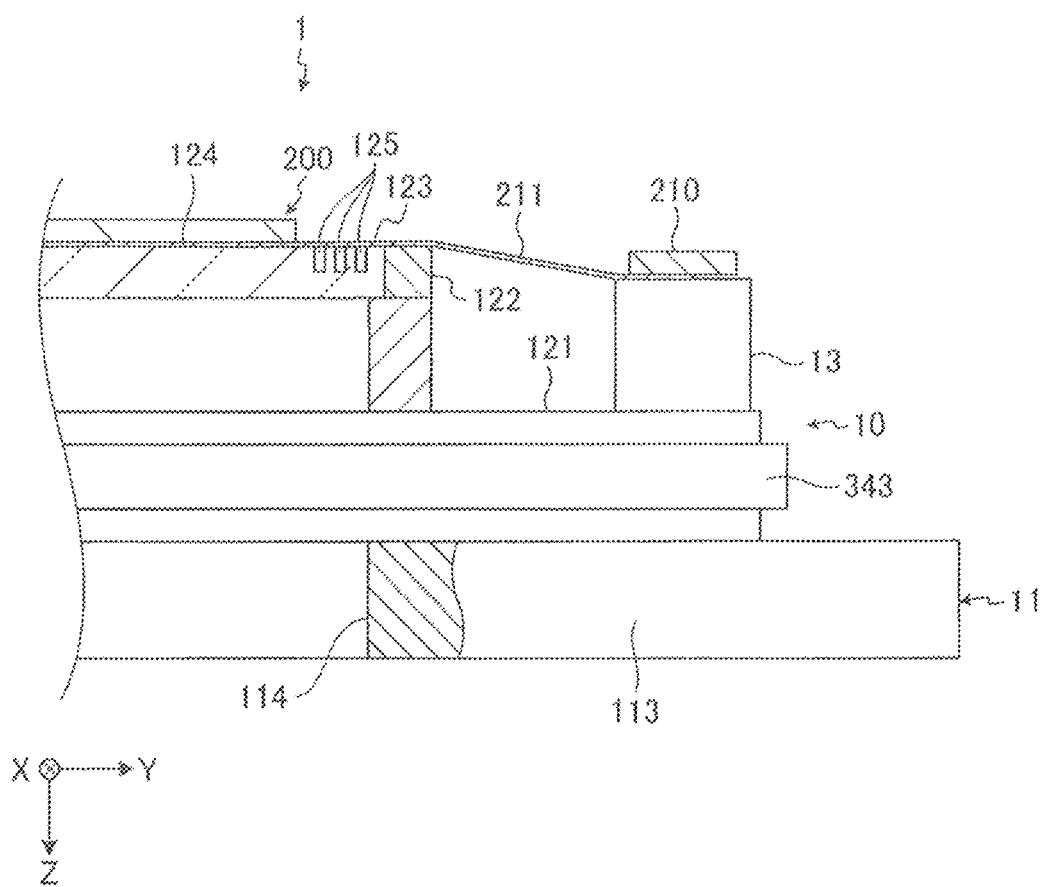
FIG. 7 is a partial sectional side view illustrating part VII in FIG. 6 in an enlarged manner.

FIG. 6 is a partial sectional side view illustrating the holding step of the processing method illustrated in FIG. 3. FIG. 7 is a partial sectional side view illustrating part VII in FIG. 6 in an enlarged manner.

The holding step ST2 is a step of holding the workpiece 200 by the holding table 12 after the execution of the table imaging step ST1. In the holding step ST2, in the processing apparatus 1, the control unit 100 controls the conveying unit to take out one workpiece 200 from the cassette 90 and place the workpiece 200 on the holding surface 124 of the holding table 12 positioned in the carrying-in/out region 4. In the holding step ST2, in the processing apparatus 1, the control unit 100 controls the vacuum suction source to suck and hold the workpiece 200 over the holding surface 124 with the intermediary of the tape 211 and suck and hold the annular frame 210 over the frame support parts 131 with the intermediary of the tape 211 as illustrated in FIG. 6 and FIG. 7. Then, the processing apparatus 1 proceeds to the imaging position decision step ST3.
(Imaging Position Decision Step)

The imaging position decision step ST3 is a step of deciding the imaging position that is the position of the workpiece 200 imaged by the workpiece imaging camera 50 in implementation of alignment, i.e., in the workpiece imaging step ST4, and the imaging position that is the position of the workpiece 200 imaged by the workpiece imaging camera 50 in implementation of kerf check, i.e., in the second workpiece imaging step ST7.

In the imaging position decision step ST3, the control unit 100 determines whether or not the imaging position of the workpiece 200 that is held by the holding table 12 and is imaged by the workpiece imaging camera 50 in implementation of alignment, stored as the processing contents information, corresponds with the position of the foreign object 301 or 302 identified in the table imaging step ST1. In the imaging position decision step ST3, when determining that the imaging position in implementation of alignment, stored as the processing contents information, does not correspond with the position of the foreign object 301 or 302 identified in the table imaging step ST1, the control unit 100 decides the imaging position stored as the processing contents information as the imaging position of the workpiece imaging step ST4.

In the imaging position decision step ST3, when determining that the imaging position in implementation of alignment, stored as the processing contents information, corresponds with the position of the foreign object 301 or 302 identified in the table imaging step ST1, the control unit 100 determines whether or not a position resulting from moving the imaging position stored as the processing contents information in a predetermined direction by a predetermined distance corresponds with the position of the foreign object 301 or 302. In the imaging position decision step ST3, the control unit 100 moves the imaging position in the predetermined direction by the predetermined distance until determining that the position resulting from the movement in the predetermined direction by the predetermined distance does not correspond with the position of the foreign object 301 or 302, and the control unit 100 decides the position determined not to correspond with the position of the foreign object 301 or 302 as the imaging position of the workpiece imaging step ST4.

Furthermore, in the imaging position decision step ST3, the control unit 100 determines whether or not the imaging position of the workpiece 200 that is held by the holding table 12 and is imaged by the workpiece imaging camera 50 in implementation of kerf check, stored as the processing contents information, corresponds with the position of the foreign object 301 or 302 identified in the table imaging step ST1. In the imaging position decision step ST3, when determining that the imaging position in implementation of kerf check, stored as the processing contents information, does not correspond with the position of the foreign object 301 or 302 identified in the table imaging step ST1, the control unit 100 decides the imaging position stored as the processing contents information as the imaging position of the second workpiece imaging step ST7.

Moreover, in the imaging position decision step ST3, when determining that the imaging position in implementation of kerf check, stored as the processing contents information, corresponds with the position of the foreign object 301 or 302 identified in the table imaging step ST1, the control unit 100 determines whether or not a position resulting from moving the imaging position stored as the processing contents information in a predetermined direction by a predetermined distance corresponds with the position of the foreign object 301 or 302. In the imaging position decision step ST3, the control unit 100 moves the imaging position in the predetermined direction by the predetermined distance until determining that the position resulting from the movement in the predetermined direction by the predetermined distance does not correspond with the position of the foreign object 301 or 302, and the control unit 100 decides the position determined not to correspond with the position of the foreign object 301 or 302 as the imaging position of the second workpiece imaging step ST7. Upon the decision of the imaging positions of the workpiece imaging steps ST4 and ST7 by the control unit 100 in the imaging position decision step ST3, the processing apparatus 1 proceeds to the workpiece imaging step ST4.

(Workpiece Imaging Step)

Figure 8:
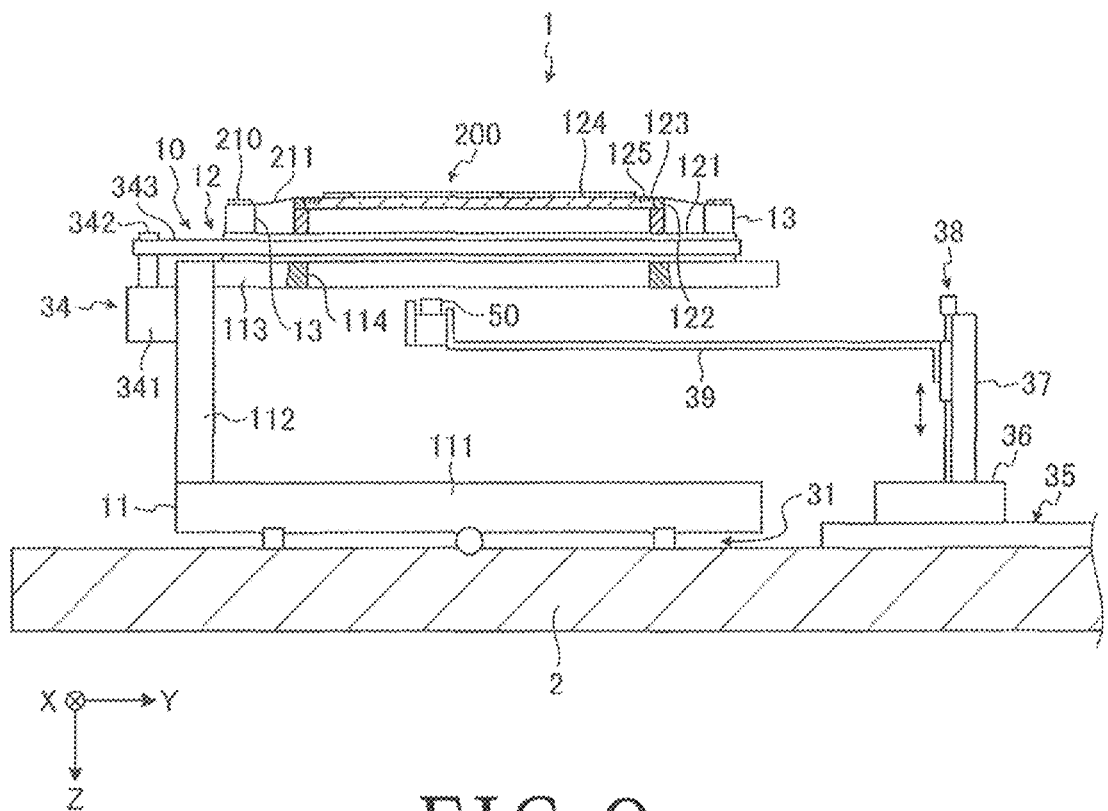
FIG. 8 is a partial sectional side view illustrating a workpiece imaging step of the processing method illustrated in FIG. 3.
Figure 9:
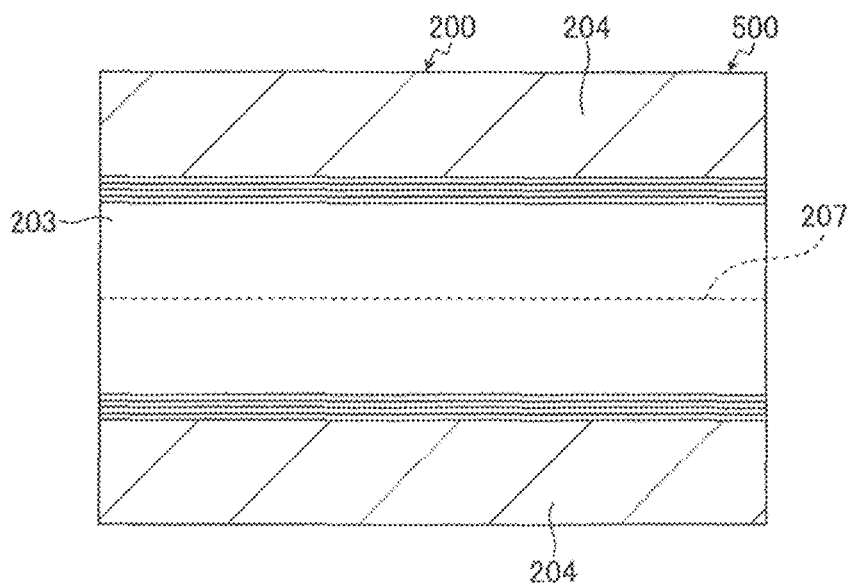
FIG. 9 is a diagram illustrating a workpiece taken image obtained in the workpiece imaging step of the processing method illustrated in FIG. 3.

FIG. 8 is a partial sectional side view illustrating the workpiece imaging step of the processing method illustrated in FIG. 3. FIG. 9 is a diagram illustrating a workpiece taken image obtained in the workpiece imaging step of the processing method illustrated in FIG. 3.

The workpiece imaging step ST4 is a step of imaging the workpiece 200 held by the holding table 12 through the transparent part 123 by the workpiece imaging camera 50 and forming a workpiece taken image 500 illustrated in FIG. 9. In the first embodiment, in the workpiece imaging step ST4, in the processing apparatus 1, the control unit 100 controls the X-axis movement unit 31 and the second Y-axis movement unit 35 to position the workpiece imaging camera 50 below the imaging position decided in the imaging position decision step ST3 regarding the workpiece 200 held by the holding table 12 as illustrated in FIG. 8.

In the workpiece imaging step ST4, in the processing apparatus 1, the control unit 100 causes the imaging position of the workpiece 200 to be imaged by the workpiece imaging camera 50 from the lower side through the transparent part 123, and acquires the workpiece taken image 500 illustrated in FIG. 9 for implementing alignment in which position adjustment between the workpiece 200 and the cutting blade 21 is executed. Then, the processing apparatus 1 proceeds to the processing position identification step ST5. In the first embodiment, in the workpiece taken image 500 illustrated in FIG. 9, a position at which the intensity of light is the strongest is represented by a white background and a position at which the intensity of light is weaker is represented by denser parallel oblique lines. Specifically, the street 203 is represented by the white background and the devices 204 are represented by coarse parallel oblique lines.

As above, in the first embodiment, in the workpiece imaging step ST4, the imaging position decided in the imaging position decision step ST3 is imaged. Due to this, the workpiece 200 is imaged with avoidance of the positions of the foreign objects 301 and 302 of the transparent part 123. Furthermore, in the workpiece imaging step ST4, by imaging the imaging position decided in the imaging position decision step ST3, the transparent part 123 is imaged excluding the foreign objects 301 and 302 of the transparent part 123 imaged in the table imaging step ST1.

(Processing Position Identification Step)

The processing position identification step ST5 is a step of identifying a processing position 207 of the workpiece 200, i.e., implementing alignment, on the basis of the workpiece taken image 500 after the execution of the workpiece imaging step ST4 and before execution of the processing step ST6. In the processing position identification step ST5, in the processing apparatus 1, the control unit 100 detects the street 203 from the workpiece taken image 500, and identifies the processing position 207 (represented by a dashed line in FIG. 9) in execution of cutting to implement alignment. Upon the identification of the processing position 207 in the processing position identification step ST5, the processing apparatus 1 proceeds to the processing step ST6. In the first embodiment, the processing position 207 represents the position through which the center of the cutting edge of the cutting blade 21 in the thickness direction passes in execution of cutting and is the center of the street 203 in the width direction.

(Processing Step, Second Imaging Step, and Check Step)

Figure 10:
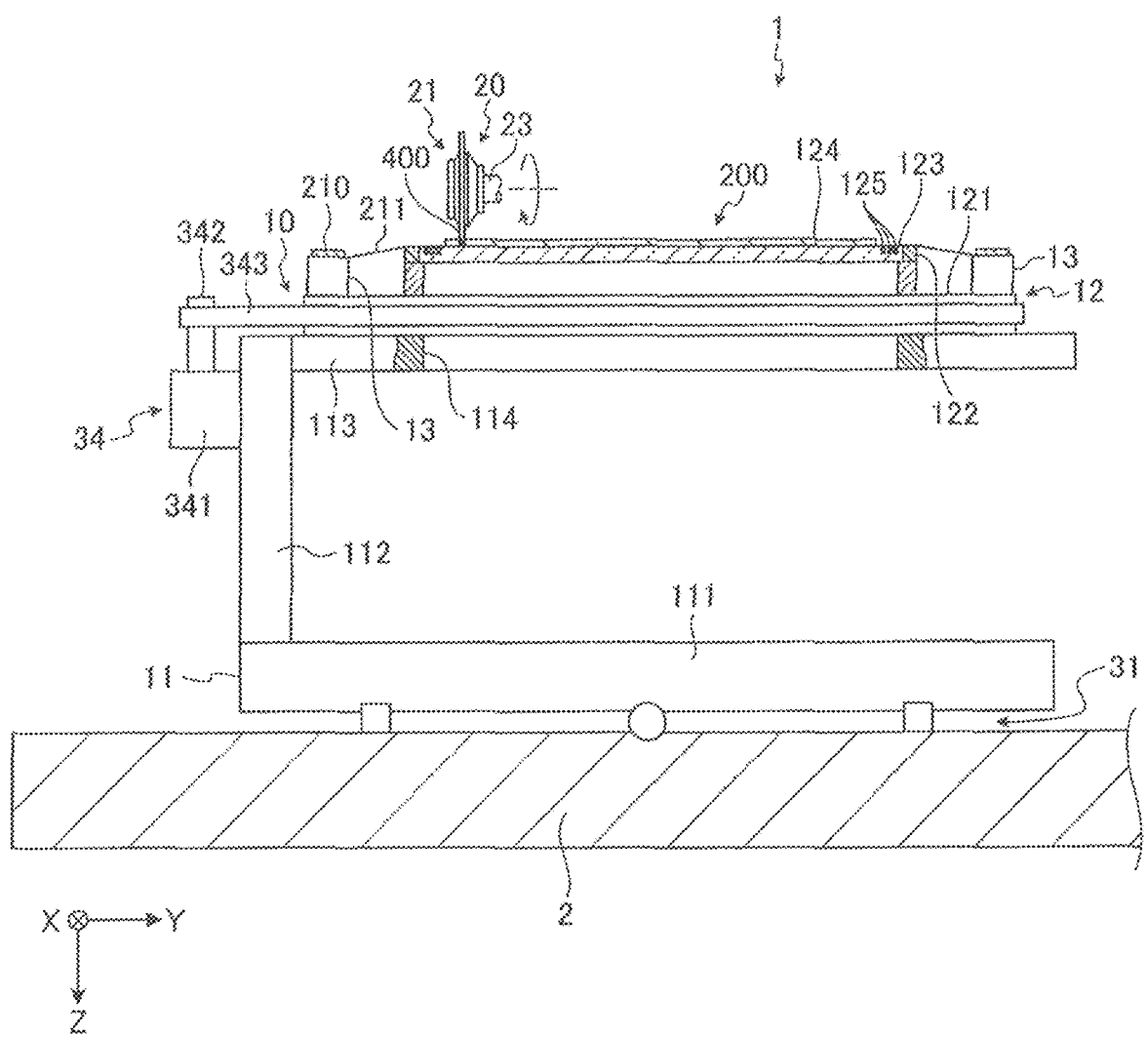
FIG. 10 is a partial sectional side view illustrating a processing step of the processing method illustrated in FIG. 3.
Figure 11:
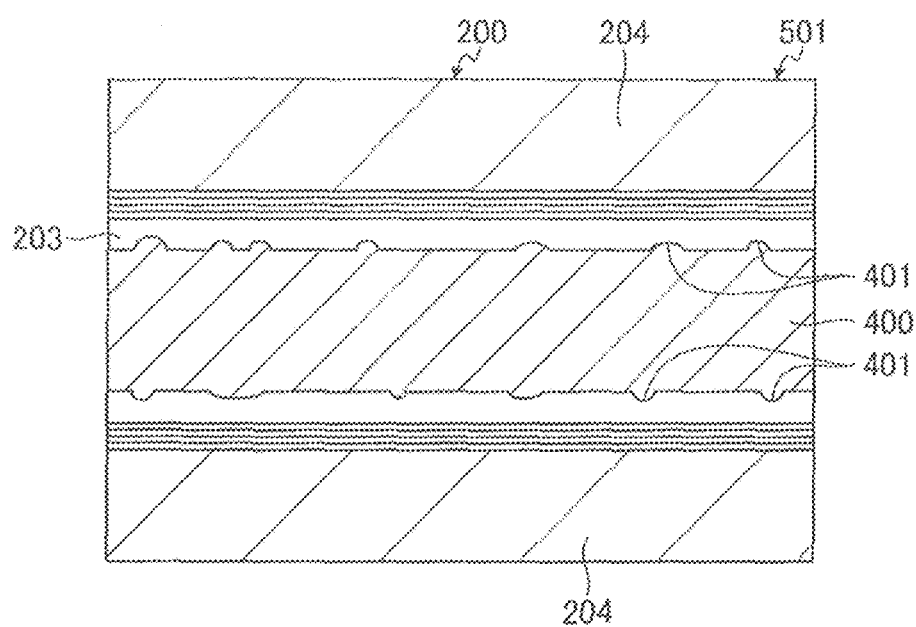
FIG. 11 is a diagram illustrating a workpiece taken image obtained in a second workpiece imaging step of the processing method illustrated in FIG. 3.

FIG. 10 is a partial sectional side view illustrating the processing step of the processing method illustrated in FIG. 3. FIG. 11 is a diagram illustrating a workpiece taken image obtained in the second workpiece imaging step of the processing method illustrated in FIG. 3.

The processing step ST6 is a step of executing cutting for the workpiece 200 held by the holding table 12 by the cutting blade 21 of the cutting unit 20. In the processing step ST6, the processing apparatus 1 starts cutting (step ST61). Upon the start of the cutting, in the processing apparatus 1, the control unit 100 controls the X-axis movement unit 31 to move the holding table 12 to the processing region 5. Furthermore, the control unit 100 controls the movement unit 30 and the cutting unit 20 to move the holding table 12 and the cutting blade 21 of the cutting unit 20 relatively along the street 203 and causes the cutting blade 21 to cut into the street 203 until reaching the tape 211 with supply of cutting water from the cutting water nozzle 24, to form the cut groove 400 in the workpiece 200.

In the processing step ST6, in the processing apparatus 1, the control unit 100 determines whether or not a predetermined number of streets 203 have been cut from the previous second workpiece imaging step ST7 (step ST62). When the control unit 100 determines that the predetermined number of streets 203 have not been cut (step ST62: No), the step ST62 is repeated. In the processing step ST6, when the control unit 100 determines that the predetermined number of streets 203 have been cut (step ST62: Yes), the processing apparatus 1 proceeds to the second workpiece imaging step ST7.

The second workpiece imaging step ST7 is a step of imaging the workpiece 200 held by the holding table 12 through the transparent part 123 by the workpiece imaging camera 50 and forming a workpiece taken image 501 illustrated in FIG. 11. In the first embodiment, in the second workpiece imaging step ST7, in the processing apparatus 1, the control unit 100 controls the X-axis movement unit 31 and the second Y-axis movement unit 35 to position the workpiece imaging camera 50 below the imaging position decided in the imaging position decision step ST3 regarding the workpiece 200 held by the holding table 12.

In the second workpiece imaging step ST7, in the processing apparatus 1, the control unit 100 causes the imaging position of the workpiece 200 to be imaged by the workpiece imaging camera 50 from the lower side through the transparent part 123, and acquires the workpiece taken image 501 illustrated in FIG. 11 for implementing kerf check. Then, the processing apparatus 1 proceeds to the check step ST8. In the first embodiment, in the workpiece taken image 501 illustrated in FIG. 11, a position at which the intensity of light is the strongest is represented by a white background and a position at which the intensity of light is weaker is represented by denser parallel oblique lines. Specifically, the street 203 is represented by the white background, and the devices 204 are represented by coarse parallel oblique lines, and the cut groove 400 is represented by dense parallel oblique lines.

As above, in the first embodiment, in the second workpiece imaging step ST7, the imaging position decided in the imaging position decision step ST3 is imaged. Due to this, the workpiece 200 is imaged with avoidance of the positions of the foreign objects 301 and 302 of the transparent part 123. Furthermore, in the second workpiece imaging step ST7, by imaging the imaging position decided in the imaging position decision step ST3, the transparent part 123 is imaged excluding the foreign objects 301 and 302 of the transparent part 123 imaged in the table imaging step ST1.

The check step ST8 is a step of checking the processing state of the workpiece 200, i.e., implementing kerf check, on the basis of the workpiece taken image 501 after the execution of the second workpiece imaging step ST7. In the check step ST8, in the processing apparatus 1, the control unit 100 checks whether or not deviation of the cut groove 400 formed in the workpiece 200 from a desired position, the size of chippings 401 generated at both edges of the cut groove 400, and so forth fall within a predetermined range. In the check ST8, in the processing apparatus 1, the control unit 100 stores the check result.

Then, in the processing step ST6, in the processing apparatus 1, the control unit 100 determines whether or not the cutting unit 20 has cut all streets 203 of the workpiece 200 held by the holding table 12 to form the cut grooves 400, i.e., whether or not the cutting of the workpiece 200 held by the holding table 12 has ended (step ST63). When the control unit 100 determines that the cutting of the workpiece 200 held by the holding table 12 has not ended (step ST63: No), the processing apparatus 1 returns to the step ST62. When the control unit 100 determines that the cutting of the workpiece 200 held by the holding table 12 has ended (step ST63: Yes), the processing apparatus 1 proceeds to the cleaning-conveyance step ST9.

During the period from the above-described step ST61 until it is determined that the cutting of the workpiece 200 has ended in the step ST63, the processing apparatus 1 is cutting the workpiece 200 held on the holding table 12. Therefore, the step ST61, the step ST62, and the step ST63 configure the processing step ST6. For this reason, in the first embodiment, during the execution of the processing step ST6, the second workpiece imaging step ST7 is executed and the check step ST8 of checking the processing state of the workpiece 200 is executed.

(Cleaning-Conveyance Step)

The cleaning-conveyance step ST9 is a step of cleaning the workpiece 200 after the cutting by the cleaning unit 92 and housing the workpiece 200 in the cassette 90. In the cleaning-conveyance step ST9, in the processing apparatus 1, the control unit 100 controls the X-axis movement unit 31 to move the holding table 12 to the carrying-in/out region 4, and controls the vacuum suction source to stop the suction holding of the workpiece 200 and the annular frame 210. In the cleaning-conveyance step ST9, in the processing apparatus 1, the control unit 100 controls the conveying unit to convey the workpiece 200 to the cleaning unit 92 and execute cleaning by the cleaning unit 92. Then, the processing apparatus 1 houses the workpiece 200 in the cassette 90 and ends the processing method according to the first embodiment. The processing apparatus 1 repeats the processing method illustrated in FIG. 3 until all workpieces 200 in the cassette 90 are cut.

In the processing method according to the first embodiment described above, in the table imaging step ST1, the foreign objects 301 and 302 such as scratches and contamination are identified based on the foreign object taken image 300 obtained through imaging the transparent part 123 by the camera 60 for detection. Furthermore, in the processing method, the transparent part 123 is imaged excluding the foreign objects 301 and 302 in the workpiece imaging steps ST4 and ST7. Therefore, appearance of the foreign objects 301 and 302 in the workpiece taken images 500 and 501 can be suppressed. As a result, the processing method provides an effect that the deterioration of the detection result of the workpiece 200 imaged through the transparent part 123 can be suppressed because the foreign objects 301 and 302 are not included in the workpiece taken images 500 and 501.

Furthermore, in the processing method, the transparent part 123 is imaged with avoidance of the positions of the foreign objects 301 and 302 in the workpiece imaging steps ST4 and ST7. Therefore, the foreign objects 301 and 302 can be prevented from being included in the workpiece taken images 500 and 501.

Moreover, the processing apparatus 1 according to the first embodiment executes the processing method according to the first embodiment and therefore provides an effect that the deterioration of the detection result of the workpiece 200 imaged through the transparent part 123 can be suppressed.

Second Embodiment

Figure 12:
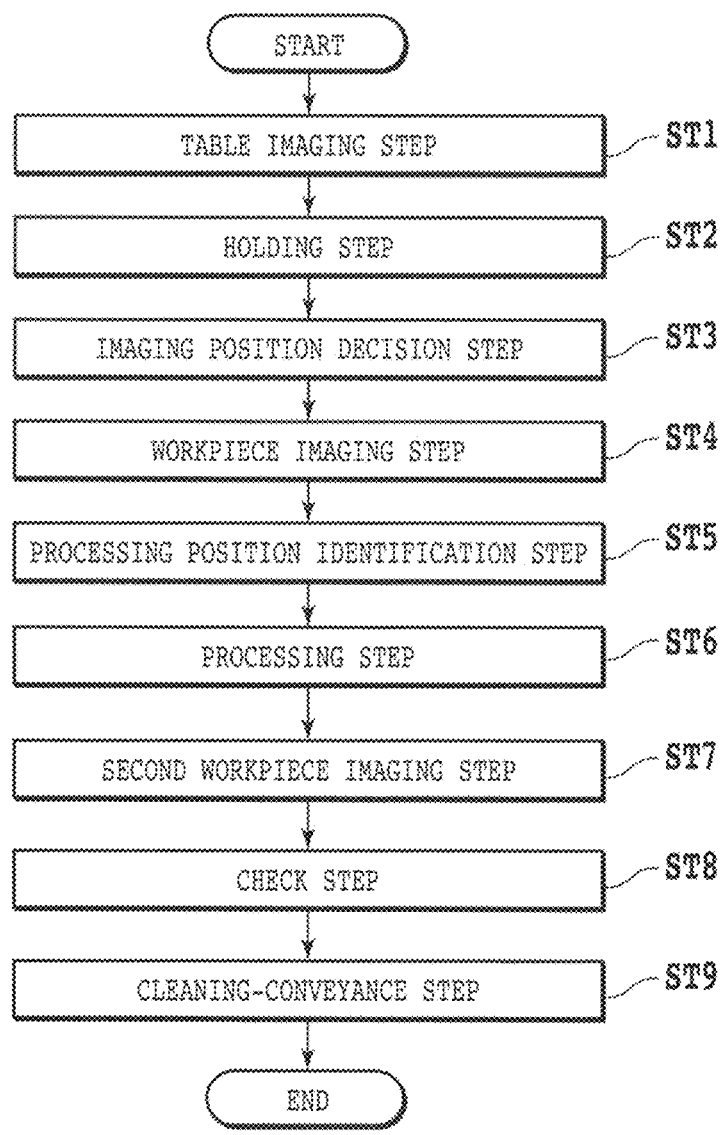
FIG. 12 is a flowchart illustrating the flow of a processing method according to a second embodiment.

A processing method according to a second embodiment of the present invention will be described based on a drawing. FIG. 12 is a flowchart illustrating the flow of the processing method according to the second embodiment. In FIG. 12, the same part as the first embodiment is given the same numeral and description thereof is omitted.

The processing method according to the second embodiment is the same as the first embodiment except for that, as illustrated in FIG. 12, after the workpiece imaging step ST4 is executed, after execution of the processing step ST6, the second workpiece imaging step ST7 is executed and the check step ST8 of checking the processing state of the workpiece 200 on the basis of the workpiece taken image 501 is executed.

The processing method and the processing apparatus 1 according to the second embodiment detect the foreign objects 301 and 302 such as scratches and contamination on the basis of the foreign object taken image 300 and image the transparent part 123 excluding the foreign objects 301 and 302 in the workpiece imaging steps ST4 and ST7. Therefore, appearance of the foreign objects 301 and 302 in the workpiece taken images 500 and 501 can be suppressed and an effect that the deterioration of the detection result of the workpiece 200 imaged through the transparent part 123 can be suppressed is provided similarly to the first embodiment.

Third Embodiment

Figure 13:
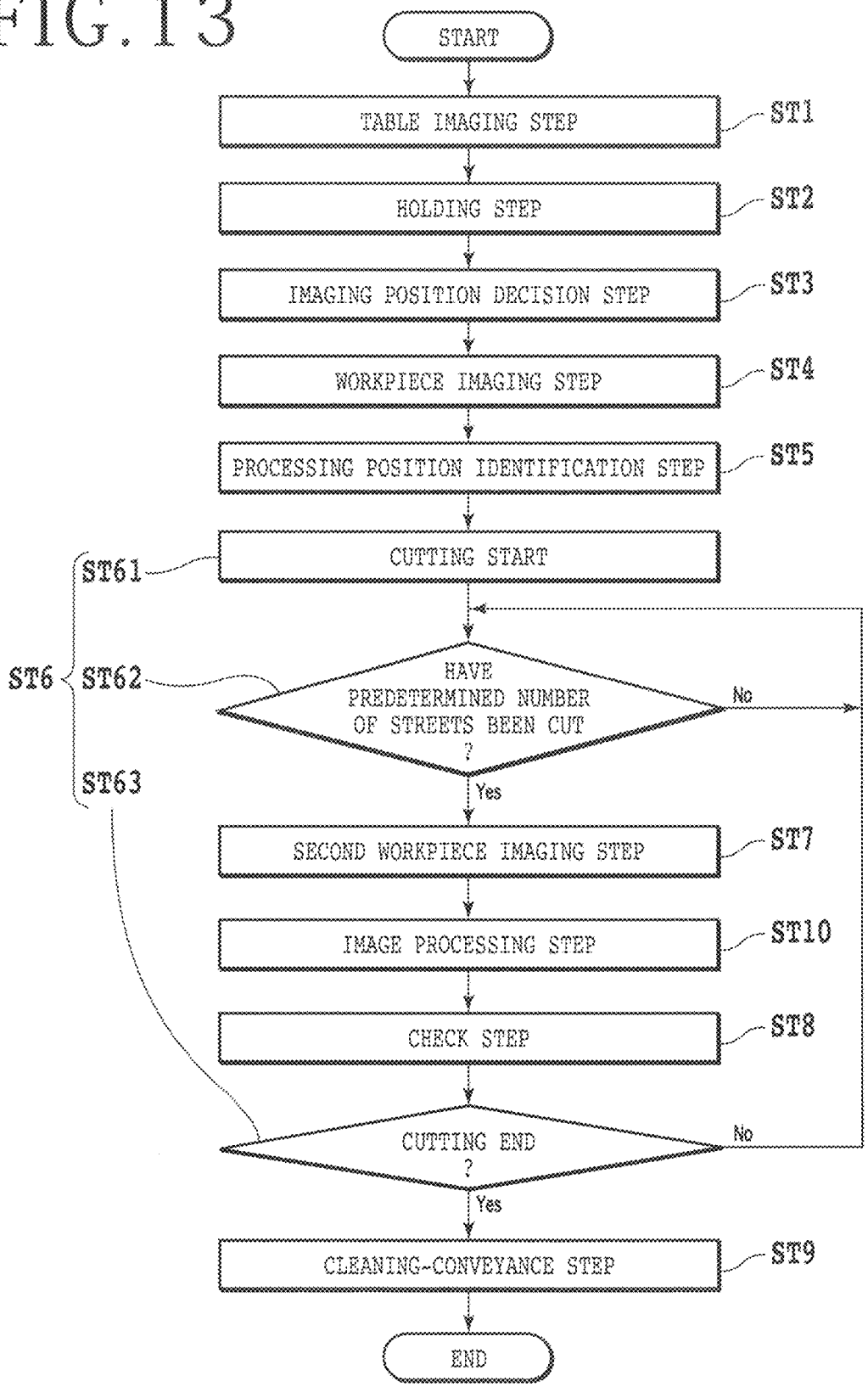
FIG. 13 is a flowchart illustrating the flow of a processing method according to a third embodiment.
Figure 14:
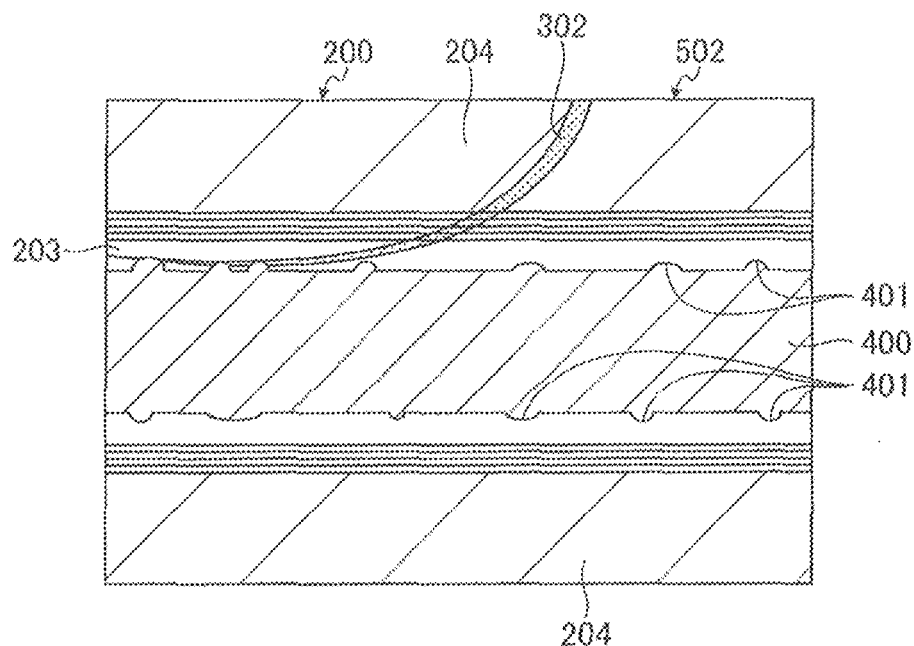
FIG. 14 is a diagram illustrating a workpiece taken image obtained in the second workpiece imaging step of the processing method illustrated in FIG. 13.
Figure 15:
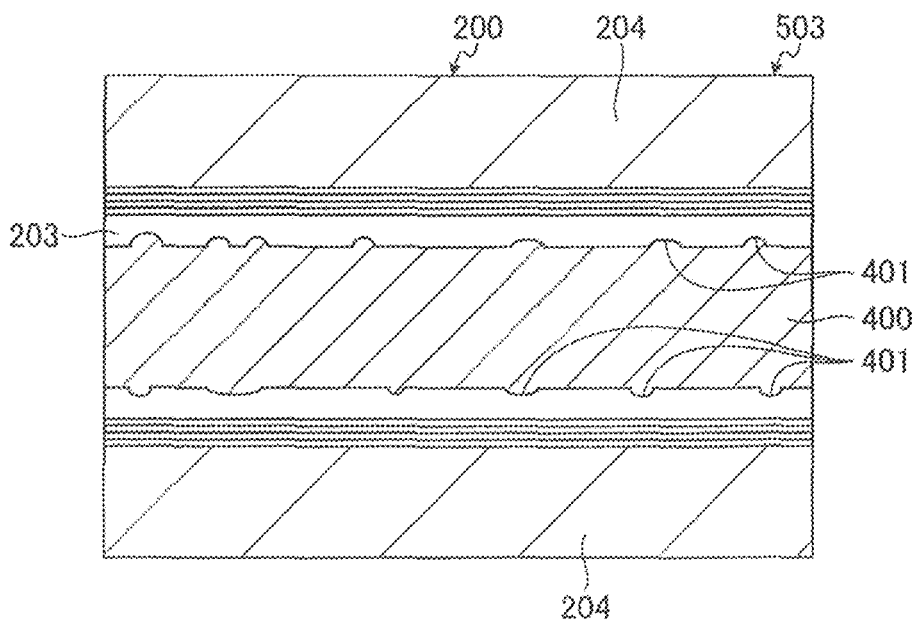
FIG. 15 is a diagram illustrating a workpiece taken image resulting from removal of a foreign object from the workpiece taken image illustrated in FIG. 14.

A processing method according to a third embodiment of the present invention will be described based on drawings. FIG. 13 is a flowchart illustrating the flow of the processing method according to the third embodiment. FIG. 14 is a diagram illustrating a workpiece taken image obtained in the second workpiece imaging step of the processing method illustrated in FIG. 13. FIG. 15 is a diagram illustrating a workpiece taken image resulting from removal of a foreign object from the workpiece taken image illustrated in FIG. 14. In FIG. 13, FIG. 14, and FIG. 15, the same part as the first embodiment is given the same numeral and description thereof is omitted.

The processing method according to the third embodiment is the same as the first embodiment except for that, as illustrated in FIG. 13, the processing method does not include the imaging position decision step ST3 and an image processing step ST10 is executed after the workpiece imaging step ST4 or ST7 is executed.

The image processing step ST10 is a step of removing the foreign objects 301 and 302 from a workpiece taken image 502 regarding which one example is illustrated in FIG. 14 on the basis of the foreign object taken image 300 and forming a workpiece taken image 503 that results from the removal of the foreign objects 301 and 302 and regarding which one example is illustrated in FIG. 15. The workpiece taken image 502 illustrated in FIG. 14 is an image obtained by imaging in the second workpiece imaging step ST7. Since the workpiece taken image 502 is similar to an image obtained by imaging in the workpiece imaging step ST4, the image obtained by imaging in the second workpiece imaging step ST7 will be described as a representative. Furthermore, the workpiece taken image 502 is an example including the foreign object 302. Since the case including the foreign object 301 is also similar, the example including the foreign object 302 will be described as a representative.

In the image processing step ST10, in the processing apparatus 1, the control unit 100 determines whether or not the workpiece taken image 502 regarding which one example is illustrated in FIG. 14 includes the foreign object 302 on the basis of the imaging position stored as the processing contents information, the positions of the foreign objects 301 and 302 identified in the table imaging step ST1, and so forth. In the image processing step ST10, in the processing apparatus 1, when determining that the workpiece taken image 502 includes the foreign object 302 as illustrated in FIG. 14, the control unit 100 identifies the foreign object 302 in the workpiece taken image 502. In the image processing step ST10, in the processing apparatus 1, the control unit 100 removes the foreign object 302 from the workpiece taken image 502 and forms the workpiece taken image 503 that is illustrated in FIG. 15 and results from the removal of the foreign object 302. The workpiece taken image 503 is used in the check step ST8.

The processing method and the processing apparatus 1 according to the third embodiment detect the foreign objects 301 and 302 such as scratches and contamination on the basis of the foreign object taken image 300 and image the transparent part 123 excluding the foreign objects 301 and 302 in the workpiece imaging steps ST4 and ST7. Therefore, appearance of the foreign objects 301 and 302 in the workpiece taken image 503 can be suppressed and an effect that the deterioration of the detection result of the workpiece 200 imaged through the transparent part 123 can be suppressed is provided similarly to the first embodiment.

Furthermore, the processing method and the processing apparatus 1 according to the third embodiment remove the foreign object 302 from the workpiece taken image 502 on the basis of the foreign object taken image 300 and therefore can prevent inclusion of the foreign object 302 in the workpiece taken image 503 used in the processing position identification step ST5 and the check step ST8. Moreover, similarly to the second embodiment, the processing method and the processing apparatus 1 according to the third embodiment may execute the second workpiece imaging step ST7 and the image processing step ST10 after execution of the processing step ST6 and execute the check step ST8 of checking the processing state of the workpiece 200 on the basis of the workpiece taken image 503.

The present invention is not limited to the above-described embodiments. That is, the present invention can be carried out with various modifications without departing from the gist of the present invention. In the above-described embodiments, in the processing apparatus 1, the processing unit is the cutting unit 20 having the spindle 23 to and from which the cutting blade 21 can be freely attached and detached. However, in the present invention, the processing unit is not limited to the cutting unit 20 and may be a laser beam irradiation unit including a laser oscillator, a collecting lens, and so forth. That is, in the present invention, the processing apparatus may be laser processing apparatus. Furthermore, in the present invention, without disposing the camera 60 for detection, the transparent part 123 of the holding table 12 that does not hold the workpiece 200 may be imaged by the upper-side camera 40 or the workpiece imaging camera 50 to form the foreign object taken image 300. In this case, it is desirable to image the transparent part 123 of the holding table 12 plural times by the upper-side camera 40 or the workpiece imaging camera 50.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method for executing processing for a workpiece, the processing method comprising:
    a table imaging step of imaging at least a portion of a transparent part of a holding table including a foreign object on a transparent part of a holding table prior to a workpiece being held by the transparent part, wherein the holding table is composed of a transparent member that forms at least part of a holding surface of the holding table and forming a foreign object taken image of the transparent part including the foreign object;
    a placing step of placing the workpiece on the holding table after executing the table imaging step;

a suctioning step of suctioning the workpiece on the holding table using at least one circular suction groove disposed at a peripheral part of the holding surface;

a workpiece imaging step of imaging the workpiece held by the holding table through the transparent part and forming a workpiece taken image of the workpiece; and a processing step of executing processing for the workpiece held by the holding table by a processing unit, wherein in the workpiece imaging step, imaging is executed excluding the foreign object on the transparent part imaged in the table imaging step.

2. The processing method according to claim 1, wherein a position of the foreign object is identified from the foreign object taken image and imaging is executed with avoidance of the position of the foreign object in the workpiece imaging step.

3. The processing method according to claim 1, further comprising:

an image processing step of removing the foreign object from the workpiece taken image on a basis of the foreign object taken image.

4. The processing method according to claim 1, further comprising:

a processing position identification step of identifying a processing position of the workpiece on a basis of the workpiece taken image after executing the workpiece imaging step and before executing the processing step.

5. The processing method according to claim 1, further comprising:

a check step of checking a processing state of the workpiece on a basis of the workpiece taken image during or after execution of the processing step after executing the workpiece imaging step.

6. The processing method according to claim 1, further comprising an identifying step of identifying a position of the foreign object in a X-axis direction and a Y-axis direction and storing the position.

7. The processing method according to claim 1, wherein the table imaging step includes imaging an entire surface of the transparent part of a holding table.

8. The processing method according to claim 1, wherein the suctioning step includes suctioning the workpiece on the holding table using a plurality of circular suction grooves concentrically disposed at a peripheral part of the holding surface.

9. A processing apparatus comprising:

a holding table having a transparent part composed of a transparent member at least in part of a holding surface, the holding table including at least one circular suction groove disposed at a peripheral part of the holding surface;

a processing unit that executes processing for a workpiece held by the holding table; and a camera positioned above the transparent part, wherein the camera is configured for taking a foreign object taken image of a portion of the transparent part of the holding table including a foreign object on the transparent part without the workpiece being on the holding table.

10. The processing apparatus according to claim 9, further comprising:

a workpiece imaging camera that images a held surface of the workpiece held by the holding table through the transparent part, wherein the camera for detection is disposed on an opposite side to the workpiece imaging camera across the holding table.

11. The processing method according to claim 1, further comprising an additional imaging step of taking an image of an upper surface of the workpiece.

12. The processing apparatus according to claim 9, further comprising an additional camera positioned above the holding table and configured for taking an image of an upper surface of the workpiece.

13. The processing apparatus according to claim 9, further comprising a control unit configured to identify a position of the foreign object in a X-axis direction and a Y-axis direction and storing the position.

14. The processing method according to claim 9, wherein the camera is configured for taking an entire image of the transparent part of the holding table.

15. The processing method according to claim 9, The processing method according to claim 9, wherein the holding table includes a plurality of circular suction grooves concentrically disposed at a peripheral part of the holding surface.

* * * * *